United States Patent [19]

Pelley, III et al.

[11] Patent Number: 4,943,743
[45] Date of Patent: Jul. 24, 1990

[54] TTL TO ECL INPUT BUFFER

[75] Inventors: Perry H. Pelley, III; Ruey J. Yu, both of Austin, Tex.

[73] Assignee: Motorola, Inc., Schaumburg, Ill.

[21] Appl. No.: 172,515

[22] Filed: Mar. 24, 1988

[51] Int. Cl.[5] .................. H03K 19/092; H03K 19/02; H03K 3/01
[52] U.S. Cl. .................................. 307/475; 307/446; 307/296.6; 307/296.7
[58] Field of Search ............... 307/443, 446, 475, 454, 307/456, 296 R, 297

[56] References Cited

U.S. PATENT DOCUMENTS 4,678,940  7/1987  Vasseghi et al. .................... 307/443

Primary Examiner—Stanley D. Miller
Assistant Examiner—M. R. Wambach
Attorney, Agent, or Firm—James Clingan, Jr.

[57] ABSTRACT

An input buffer for translating TTL level signals to ECL level signals has a level shifter having a first and a second inupt transistor. The first input transistor receives the input signal and the second transistor receives a reference voltage. First and second transistor loads are coupled to the first and second transistors, respectively. Both the first and second loads are biased to the same saturation current. The saturation current is derived from a current source. The reference voltage is set at a voltage which is between the maximum voltage of a logic low of the input signal and the minimum voltage of a high of the input signal. The deferential level shifter develops a voltage differential which is converted to ECL level signals by a differential amplifier.

13 Claims, 1 Drawing Sheet

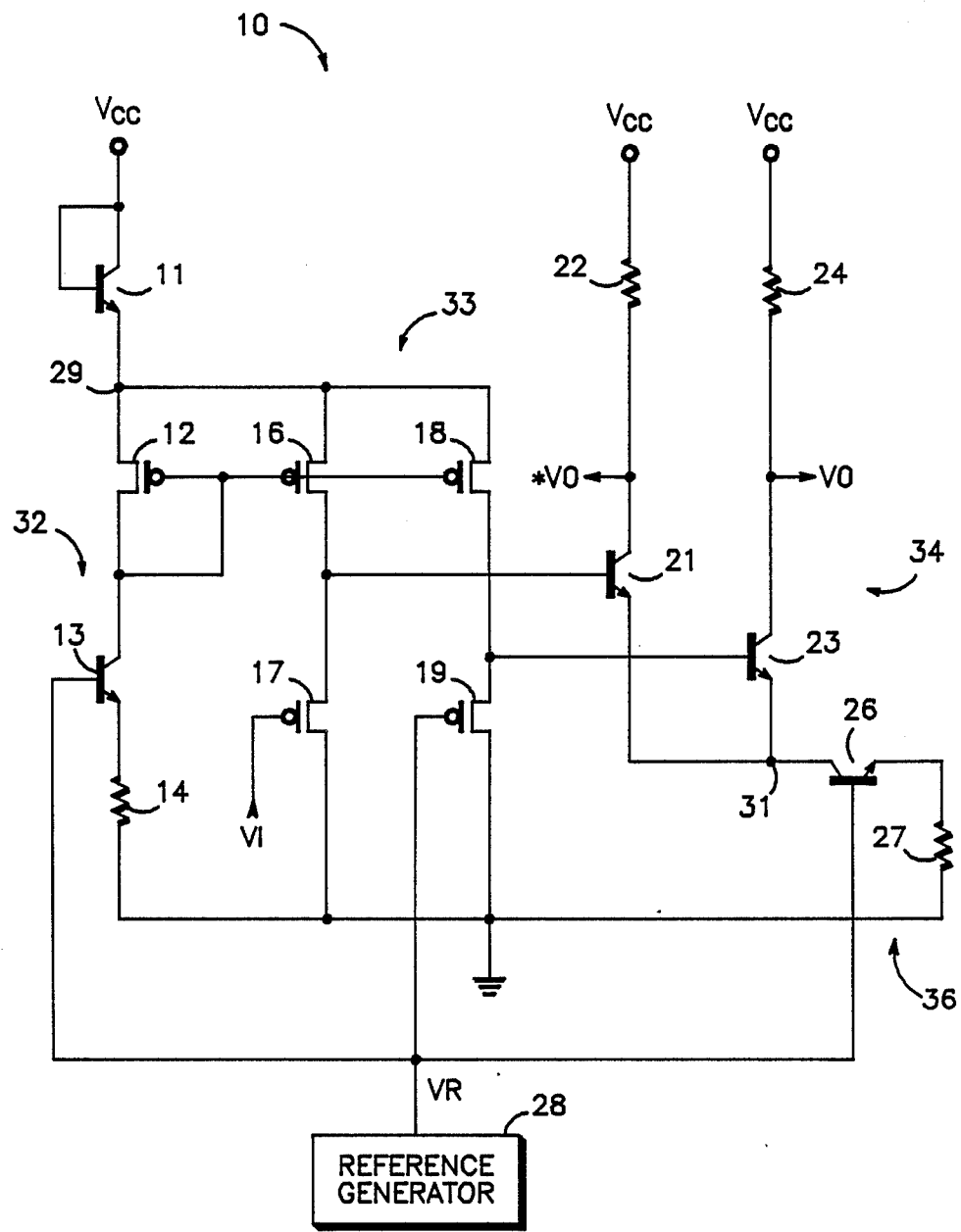

4,943,743

TTL TO ECL INPUT BUFFER

FIELD OF THE INVENTION

The invention relates to integrated circuits which have both CMOS and bipolar transistors, and more particularly, to input buffers for such integrated circuits.

BACKGROUND OF THE INVENTION

Integrated circuits typically, must be able to interface with integrated circuits of more than one type. For example, it is a common requirement for an integrated circuit to be able to receive both CMOS and TTL signals. This is true particularly for integrated circuits that are intended for wide applicability. One such example is an integrated circuit memory which is intended to be applicable to a variety of systems. In the case of an integrated circuit memory which has both CMOS and bipolar circuits, it is typical to use CMOS for the array and some other power saving aspects and to use bipolar circuits in the peripheral circuits for speed. One example of a memory which uses both bipolar and CMOS circuits is described in U.S. Pat. No. 4,713,796, Oguie et al. For the case in which bipolar transistors are used to make emitter coupled logic (ECL) for an integrated circuit which also has CMOS, it has naturally been assumed that an ECL circuit should be used as the input buffer because ECL circuits are very fast. ECL integrated circuits have been available for many years and a great many ECL circuits have been developed for a wide variety of purposes. The current ECL input buffers, although effective, do consume more power than is optimally desirable.

SUMMARY OF THE INVENTION

Accordingly, it is an object of the present invention to provide an improved BICMOS input buffer.

It is another object of the present invention to provide an improved BICMOS integrated circuit for interfacing with TTL input signals.

It is yet another object of the invention to provide an improved TTL to ECL input buffer.

In carrying out these and other objects of the invention, there is provided, in one form, a TTL to ECL translator for converting an input signal having a logic low no greater than a first voltage level and a logic high no less than a second voltage level to a complementary pair of signals at ECL voltage levels. The translator has a reference generator circuit, a current reference generator circuit, a differential level shifter, and a differential amplifier. The reference generator circuit generates a reference voltage at a voltage which is greater than the first voltage level and less than the second voltage level. The current reference generator circuit generates a reference current and provides a load signal indicative of the reference current. The differential level shifter has a pair of transistor loads, a pair of outputs, and a pair of inputs. The transistor loads have a saturation current set by the load signal. The pair of inputs of the differential level shifter receive the TTL input signal and the reference voltage. The differential amplifier has a pair of inputs coupled to the pair of outputs of the differential level shifter and a pair of outputs for providing the pair of complementary signals at ECL levels.

BRIEF DESCRIPTION OF THE DRAWINGS

The sole figure is a circuit diagram of an input buffer according to a preferred embodiment of the invention.

DETAILED DESCRIPTION OF THE INVENTION

Shown in the figure is an input buffer 10 comprised of an NPN transistor 11, a P channel transistor 12, an NPN transistor 13, a resistor 14, a P channel transistor 16, a P channel transistor 17, a P channel transistor 18, a P channel transistor 19, an NPN transistor 21, a resistor 22, an NPN transistor 23, a resistor 24, an NPN transistor 26, a resistor 27, and a reference generator 28. Transistor 11 has a collector and a base connected to a positive power supply terminal VCC for receiving a positive power supply voltage of, for example, 5 volts, and an emitter connected to a node 29. Transistor 12 has a source connected to node 29, and a gate and a drain connected together. Transistor 13 has a collector connected to the gate and drain of transistor 12, a base for receiving a reference voltage VR from reference voltage generator 28, and an emitter. Resistor 14 has a first terminal connected to the emitter of transistor 13, and a second terminal connected to ground. Transistor 16 has a source connected to node 29, a gate connected to the collector of transistor 13, and a drain. Transistor 17 has a source connected to the drain of transistor 16, a gate for receiving an input signal which may be an output from a TTL circuit, and a drain connected to ground. Transistor 18 has a source connected to node 29, a gate connected to the collector of transistor 13, and a drain. Transistor 19 has a source connected to the drain of transistor 18, a gate for receiving reference voltage VR, and a drain connected to ground. Transistor 21 has a base connected to the source of transistor 17, an emitter connected to a node 31, and a collector for providing a complementary output signal *VO. Resistor 22 has a first terminal connected to the collector of transistor 21, and a second terminal connected to VCC. Transistor 23 has a base connected to the source of transistor 19, an emitter connected to node 31, and a collector for providing a true output signal VO. Resistor 24 has a first terminal connected to the collector of transistor 23, and a second terminal connected to VCC. Transistor 26 has a collector connected to node 31, a base for receiving reference voltage VR, and an emitter. Resistor 27 has a first terminal connected to the emitter of transistor 26, and a second terminal connected to ground.

Operationally, transistor 11 sets node 29 at a base-emitter voltage drop (Vbe) below the voltage at VCC, transistor 13 and resistor 14 form a current source 32, transistors 16-19 form a differential level shifter 33, and transistors 21, 23, and 26 and resistors 22, 24, and 27 form an ECL differential amplifier 34, and transistor 26 and resistor 27 form a current source 36 as part of differential amplifier 34. The current through current source 32 is set by reference voltage VR and the resistance of resistor 14. The voltage across resistor 14 is one Vbe below the voltage of reference voltage VR which establishes the current through resistor 14 at a known value. The current through transistor 12 is only slightly less than the current through resistor 14. This current through transistor 12 is mirrored to transistors 16 and 18 to set the effective current carrying capability of transistors 16 and 18. Transistor 19 receives reference voltage VR which is fixed with respect to ground. Transistor 17 receives signal VI which may have a logic low as high as 1.0 volt and a logic high as low as 2.0 volt. Reference voltage VR is selected to be at some voltage which is between the maximum logic low (MLL) voltage and the minimum logic high (MLH) voltage. The optimum voltage for reference voltage VR is greater than half way between the MLL and MLH voltages at about 1.7 voltage. Because of noise on the ground terminal due to output current transients, it is desirable to have reference VR at a higher than mid-point voltage. Inductance in the output leads causes a voltage rise on the internal ground when there is a rapid change in current to the ground terminal which occurs often. This is a common problem often referred to as di/dt noise. Raising the trip point of level shifter 33 to 1.7 provides greater margin to di/dt noise while retaining sufficient margin below the MLH voltage. With reference voltage VR between the MLL and MLH voltages, transistor 17 will be certain to be more conductive than transistor 19 when signal VI is a logic low and will also be certain to be less conductive than transistor 19 when signal VI is a logic high. Transistors 16 and 18 are fixed at the same current carrying capability so that there is a clear voltage differential established between the sources of transistors 17 and 19 which voltage differential is coupled to differential amplifier 34. Differential amplifier 34 receives this voltage differential developed by differential amplifier 33 and provides ECL level output signals VO and *VO.

Transistors 16 and 18 are manufactured to be identical. This can be done quite effectively. Two transistors of the same type have characteristics which track very closely with process variations. Thus, because both transistor 16 and 18 have the same gate to source voltage, the saturation currents of transistors 16 and 18 are as a practical matter in fact virtually identical. With bandgap reference techniques, which are well known, reference voltage VR can be set to the desired voltage, 1.7 volts in the present example, very accurately so that the current through transistor 12, which sets the saturation current of transistors 16 and 18, can be set within a well defined range. Transistors 17 and 19 are chosen to be P channel transistors which matches the same type as that of transistors 16 and 18. Thus, the bias point, the voltage on the source of transistor 19, can be ensured of being near the optimal level, which for the present example, is about 60 percent of the voltage at node 29. The bias point of level shifter 33, the voltage at the source of transistor 19, is set very precisely because the gains of transistors 19 and 18 have a ratio which can be very accurately set. Transistors 18 and 19 have gains and threshold voltages which track each other over process and temperature variations. The voltage at node 29 is also temperature compensated because the magnitude of the threshold voltage of a P channel transistor increases with increases in temperature, whereas the Vbe of an NPN transistor decreases with increases in temperature. Thus, transistors 11 and 12 compensate each other over temperature variations. Transistors 17 and 19 are in a source follower configuration so that differential level shifter 33 does not provide voltage gain but raises the bias point to the optimum for ECL operation. The voltage differential between signal VI and reference voltage VR is about the same as the voltage differential between the sources of transistors 17 and 19. Differential amplifier 34 provides the necessary gain for internal use of input signal VI as represented internally by signals VO and *VO.

The desired bias point for level shifter 33 could be set by a different combination of gain ratios of transistors 18 and 19 and a different voltage for reference voltage VR. Transistor 18 could be made to have a lower conductance which would tend to lower the voltage at the source of transistor 19, and reference voltage VR could be raised in voltage to make transistor 19 less conductive which would tend to raise the voltage at the source of transistor 19. These two opposing tendencies could be used to keep the bias voltage of level shifter 33 at the desired level. To do this approach would require that transistors 16 and 18 to not have the same gain. This would still provide excellent tracking between transistors 16 and 18 over process and temperature if the difference in gain was not too large.

The reference voltage for current sources 32 and 36 could be different than that used for setting the bias point of level shifter 33. For the operation of differential amplifier 34, the optimum voltage for current source 36 is about 1.1 volts. Thus, a reference voltage in addition to reference voltage VR may be generated for current source 36. It is also not necessary that current source 36 and current source 32 be driven by the same reference voltage. Of course, there is the advantage of simplicity in using the same reference voltage for level shifter 33 and current sources 32 and 36.

The voltage at node 29 is stepped down from VCC to help prevent transistor 21 from becoming saturated in the case in which transistor 17 becomes non-conductive. Transistor 17 can become completely non-conductive for the case in which signal VI is a logic high at a voltage well above the minimum voltage for a logic high. If transistor 17 becomes completely non-conductive, the voltage provided to the base of transistor 21 from transistor 16 will be very nearly the same voltage as is present on the source of transistor 16. Thus, if transistor 16 had its source connected to VCC, the base of transistor 21 could be at nearly VCC so that a small voltage drop across resistor 22 would result in the collector of transistor 21 being at a lower voltage than the base of transistor 21. A bipolar transistor in saturation responds more slowly than if it were not in saturation.

Differential amplifier 34 responds to the voltage differential across the sources of transistors 17 and 19 by converting this voltage differential to ECL logic levels. Subsequent ECL circuits can thus respond to signals VO and *VO. Signal VI could be, for example, an address or data in a memory integrated circuit which had ECL peripheral circuits. Input buffer 10 responds to signal VI very quickly while not requiring large amounts of current.

We claim:
1. An input buffer comprising:
a first transistor having a first current electrode coupled to a first power supply terminal, a control electrode for receiving an input signal, and a second current electrode;
a second transistor having a first current electrode coupled to the first power supply terminal, a control electrode for receiving a reference voltage, and a second current electrode;
a current reference generator for generating a reference current and providing a load signal indicative of the reference current;
a first load transistor having a first current electrode coupled to the second current electrode of the first transistor, a control electrode for receiving the load signal, and a second current electrode coupled to a second power supply terminal;

a second load transistor having a first current electrode coupled to the second current electrode of the second transistor, a control electrode for receiving the load signal, and a second current electrode coupled to the second power supply terminal; and a differential amplifier having a first input coupled to the second current electrode of the first transistor, a second input coupled to the second current electrode of the second transistor, and first and second outputs representative of a voltage differential between the first and second inputs.

2. A translator for converting an input signal having a logic low no greater than a first voltage level and a logic high no less than a second voltage level to a complementary pair of signals at ECL voltage levels, comprising:

reference generator means for generating a reference voltage at a voltage which is greater than the first voltage level and less than the second voltage level;

a current reference generator for generating a reference current and providing a load signal indicative of the reference current;

a differential level shifter having a pair of transistor loads for receiving the load signal, a pair of inputs for receiving the input signal and the reference voltage, and a pair of outputs; and a differential amplifier having a pair of inputs coupled to the pair of outputs of the differential level shifter and a pair of outputs for providing the pair of complementary signals at ECL levels.

3. The translator of claim 2 wherein the pair of transistor loads of the differential level shifter each have a saturation current set by the load signal.

4. The translator of claim 3 wherein the pair of transistor loads comprises:

a first P channel transistor having a first current electrode coupled to a first supply node, a control electrode for receiving the load signal, and a second current electrode coupled to a first output of the pair of outputs of the differential level shifter; and a second P channel transistor having a first current electrode coupled to the first supply node, a control electrode for receiving the load signal, and a second current electrode coupled to a second output of the pair of outputs of the differential level shifter.

5. The translator of claim 4 wherein the differential level shifter is further characterized as comprising:

a third P channel transistor having a first current electrode coupled to a first power supply terminal, a control electrode for receiving the input signal, and a second current electrode coupled to the second current electrode of the first P channel transistor; and a fourth P channel transistor having a first current electrode coupled to the first power supply terminal, a control electrode for receiving the reference voltage, and a second current electrode coupled to the second current electrode of the second P channel transistor.

6. The translator of claim 5 further comprising a first NPN transistor having a collector coupled to a second power supply terminal, and a base and emitter coupled to the supply node.

7. The translator of claim 6 wherein the current reference generator comprises:

first current source means for drawing current of a predetermined magnitude from a first current node to the first power supply terminal; and a fifth P channel transistor having a first current electrode coupled to the first supply node, and a second current electrode and a control electrode coupled to the first current node for providing the load signal.

8. The translator of claim 7 wherein the first current source means comprises:

a second NPN transistor having a base for receiving the reference voltage, a collector coupled to the first current node, and an emitter; and a first resistor having a first terminal coupled to the emitter of the second NPN transistor, and a second terminal coupled to the first power supply terminal.

9. The translator of claim 8 wherein the differential amplifier comprises:

second current source means for drawing current of a predetermined magnitude from a second current node to the first power supply terminal;

a third NPN transistor having an emitter coupled to the second current node, a base coupled to the second current electrode of the third P channel transistor, and a collector;

a second resistor having a first terminal coupled to the collector of the third NPN transistor, and a second terminal coupled to the second power supply terminal;

a fourth NPN transistor having an emitter coupled to the second current node, a base coupled to the second current electrode of the fourth P channel transistor, and a collector; and a third resistor having a first terminal coupled to the collector of the fourth NPN transistor, and a second terminal coupled to the second power supply terminal.

10. The translator of claim 9 wherein the second current source means comprises:

a fifth NPN transistor having a base for receiving the reference voltage, a collector coupled to the second current node, and an emitter; and a first resistor having a first terminal coupled to the emitter of the fifth NPN transistor, and a second terminal coupled to the first power supply terminal.

11. A translator for converting an input signal having a logic low no greater than a first voltage level and a logic high no less than a second voltage level to a complementary pair of signals at ECL voltage levels, comprising:

reference generator means for generating a reference voltage at a voltage which is greater than the first voltage level and less than the second voltage level;

a current reference generator for generating a reference current and providing a load signal indicative of the reference current;

a differential level shifter coupled between a supply node and a first power supply terminal and having a pair of transistor loads for receiving the load signal, a pair of inputs for receiving the input signal and the reference voltage, and a pair of outputs;

drop means for providing a voltage differential between a second power supply terminal and the supply node of a predetermined amount;

a differential amplifier having a pair of inputs coupled to the pair of outputs of the differential level shifter and a pair of outputs for providing the pair of complementary signals at ECL levels.

12. The translator of claim 11 wherein the pair of transistor loads comprises:

a first P channel transistor having a first current electrode coupled to the supply node, a control electrode for receiving the load signal, and a second current electrode coupled to a first output of the pair of outputs of the differential level shifter; and a second P channel transistor having a first current electrode coupled to the supply node, a control electrode for receiving the load signal, and a second current electrode coupled to a second output of the pair of outputs of the differential level shifter.

13. The translator of claim 12 wherein the current reference generator comprises:

first current source means for drawing current of a predetermined magnitude from a first current node to the first power supply terminal; and a third P channel transistor having a first current electrode coupled to the first supply node, and a second current electrode and a control electrode coupled to the first current node for providing the load signal.

* * * * *